(12) United States Patent
Das et al.

(10) Patent No.: US 8,288,857 B2
(45) Date of Patent: Oct. 16, 2012

(54) ANTI-TAMPER MICROCHIP PACKAGE BASED ON THERMAL NANOFLUIDS OR FLUIDS

(75) Inventors: Rabindra N. Das, Vestal, NY (US); Voya R. Markovich, Endwell, NY (US); James J. McNamara, Jr., Vestal, NY (US); Mark D. Poliks, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 74 days.

(21) Appl. No.: 12/884,421

(22) Filed: Sep. 17, 2010

(65) Prior Publication Data

US 2012/0068326 A1 Mar. 22, 2012

(51) Int. Cl.
*H01L 23/22* (2006.01)
*H01L 23/12* (2006.01)

(52) U.S. Cl. ........ 257/687; 257/704; 257/715; 257/716; 257/778; 257/E23.194

(58) Field of Classification Search .................. 257/687, 257/704, 778, 715, 716, E23.194
See application file for complete search history.

(56) References Cited

U.S. PATENT DOCUMENTS

| | | | |
|---|---|---|---|
| 4,236,463 A | 12/1980 | Westcott | |
| 4,990,462 A * | 2/1991 | Sliwa, Jr. | 438/107 |
| 5,780,928 A * | 7/1998 | Rostoker et al. | 257/713 |
| 5,918,665 A * | 7/1999 | Babcock et al. | 165/104.33 |
| 6,379,988 B1 * | 4/2002 | Peterson et al. | 438/51 |
| 6,421,013 B1 * | 7/2002 | Chung | 343/700 MS |
| 6,956,283 B1 * | 10/2005 | Peterson | 257/680 |
| 7,000,684 B2 * | 2/2006 | Kenny et al. | 165/80.4 |
| 7,065,656 B2 * | 6/2006 | Schwenck et al. | 713/194 |
| 7,176,488 B2 * | 2/2007 | Kim et al. | 257/59 |
| 7,494,608 B2 | 2/2009 | Li et al. | |
| 7,685,438 B2 | 3/2010 | Knudsen | |
| 2011/0180923 A1 * | 7/2011 | Humenik et al. | 257/704 |

* cited by examiner

*Primary Examiner* — Nitin Parekh
(74) *Attorney, Agent, or Firm* — Mark Levy; Hinman, Howard & Kattell, LLP (57) ABSTRACT

A tamper-resistant microchip package contains fluid- or nanofluid-filled capsules, channels, or reservoirs, wherein the fluids, either alone or in combination, can destroy circuitry by etching, sintering, or thermally destructing when reverse engineering of the device is attempted. The fluids are released when the fluid-filled cavities are cut away for detailed inspection of the microchip. Nanofluids may be used for the sintering process, and also to increase the thermal conductivity of the fluid for die thermal management. Through-vias and micro vias may be incorporated into the design to increase circuitry destruction efficacy by improving fluid/chip contact. Thermal interface materials may also be utilized to facilitate chip cooling.

25 Claims, 5 Drawing Sheets

Prior Art

ANTI-TAMPER MICROCHIP PACKAGE BASED ON THERMAL NANOFLUIDS OR FLUIDS

FIELD OF THE INVENTION

The present invention relates to tamper-resistant microchip technology and, more particularly, to microchip packages comprising fluid- or nanofluid-filled capsules, channels, or reservoirs in which fluid released during a tampering event will destroy dies or circuitry via etching, sintering, or thermal destruction.

BACKGROUND OF THE INVENTION

The development of microelectronic circuitry is presently one of the most active areas of technological advancement, and therefore demands substantial economic and infrastructure resources. To recoup their investment and maintain a competitive position in the marketplace, microelectronic device manufacturers strive to protect their cutting-edge technologies from unauthorized disclosure. Once the development of microelectronic components reaches the manufacturing stage, however, and the devices are distributed to customers or otherwise fall into the hands of third parties, manufacturers lose a great deal of control over their respective technologies. At that point, undesired reverse engineering by third parties becomes a significant concern.

It is the microprocessor element of the chip package that generally contains the sensitive, cutting-edge technology that is sought to be protected from disclosure. With prior art microchip devices, third parties may isolate the microprocessor for detailed evaluation by removing it from the chip package by, for example, grinding or separating (cutting) the substrate or lid to expose the microprocessor chip. The exposed microprocessor chip may then be analyzed with a suitable device, such as a microscope, thereby enabling the unauthorized third party to gain access to valuable trade secret information. Lockable cases or the like are insufficient because these may be cut away and removed to expose the chip package, which may then be reverse engineered as described above.

Presently, no known effective method prevents reverse engineering; third parties, after coming into physical possession of the sensitive technological devices, can take them to a laboratory and manipulate them at will. There is a need, therefore, to provide a chip level package that will frustrate or defeat third party attempts to reverse engineer sensitive technologies, even when the third parties have uninhibited access to the microprocessor chip package.

The most effective method of protection would be a quality inherent in the chip package itself, which would serve to destroy microprocessor components if attempts at reverse engineering are made. In particular, this could be accomplished by a chip package that would result in destruction of the microprocessor upon attempts to separate the chip from the chip package components, such as the substrate or lid, before attempts could be made to analyze it under a microscope. Destruction of the microprocessor, as described, would further prevent the extraction of sensitive software or memory stored in the chip.

Integrated circuit boards are constructed by depositing a conductive or semi-conductive layer onto a non-conductive board or substrate. A chip trace is then laid out on the board with a protective, chemically-inert coating. An etchant is applied to the surface of the board, which dissolves the portion of the conductive or semi-conductive layer not protected by the coating. The coating is then removed, leaving the bare chip trace behind.

Certain chemical processes typically used in the microprocessor manufacturing industry may be incorporated into tamper-resistant microprocessor chip packages. One of these chemical processes involves the etching of the chip circuitry.

U.S. Pat. No. 7,494,608 issued to Li et al. for STABILIZED SILVER NANOPARTICLE COMPOSITION discloses an example of a fluid that may be suitable for use with the present invention. Therein is described a composition comprising a liquid and a plurality of silver-containing nanoparticles with a stabilizer, wherein the silver-containing nanoparticles are a product of a reaction of a silver compound with a reducing agent comprising a hydrazine compound in the presence of a thermally removable stabilizer in a reaction mixture comprising the silver compound, the reducing agent, the stabilizer, and an organic solvent wherein the hydrazine compound is a hydrocarbyl hydrazine, a hydrocarbyl hydrazine salt, a hydrazide, a carbazate, and sulfonohydrazide, or a mixture thereof, and wherein the stabilizer includes an organoamine. Electronic circuit elements may be fabricated by depositing a composition comprising a liquid and a plurality of silver-containing nanoparticles with a stabilizer on a substrate by a liquid deposition technique to form a deposited composition.

It is believed that the present invention contains a high degree of novelty in the field of microelectronic devices. No known prior art is closely related to the technology disclosed herein. A brief discussion of prior art references is presented below, however, as a point of comparison.

In U.S. Pat. No. 7,685,438 issued to Knudsen for TAMPER-RESISTANT PACKAGING AND APPROACH USING MAGNETICALLY-SET DATA there is described a tamper-resistant packaging approach that protects an integrated circuit from undesirable access. According to an example embodiment, data is encrypted as a function of the state of a plurality of magnetically-responsive circuit element and then decrypted as a function of the state. A package is arranged to prevent access to the integrated circuit and having magnetic particles therein. The magnetic particles are arranged to cause the magnetically-responsive circuit elements to take on a state that is used to encrypt the data. The state of these elements is again used to decrypt the data (e.g., as a key). When the magnetic particles are altered, for example by removing a portion of the package, the state of one or more of the magnetically-responsive circuit elements is changed, thus rendering the state incapable of being used for decrypting the data.

Under certain circumstances, encryption of integrated circuit data and subsequent decryption by use of a magnetic key could offer sufficient protection of sensitive data electronically stored on a chip. In other circumstances, however, a more robust form of protection may be necessary. Magnetic encryption/decryption technology, for instance, would not protect the chip architecture from reverse engineering by third parties. Moreover, damage or destruction to the chip components, as described hereinbelow, will permanently render the information contained thereon unreadable.

U.S. Pat. No. 4,236,463 issued to Westcott for TAMPER PROOF CASE FOR THE PROTECTION OF SENSITIVE PAPERS describes a technology for protecting sensitive papers. A carrying case having a hinged lid, with handle and locks, contains internal components that will be destroyed during a tampering event. Within the interior of the case and hingedly connected to the case is a liner, within which are stored sensitive papers. A thermite charge is disposed within a removable boat in the liner and has igniters electrically connected, through a selectively positionable key operated switch, to a battery and through various switch members so that the igniters are triggered upon the occurrence of one of various tampering events. Upon the making of an electrical circuit, the igniters ignite the thermite charge to burn or char the papers, the gases escaping through an opening in the lid of the case. The similarity between this and the present invention is the permanent destruction of sensitive, internal components upon tampering. While conceptually similar, the present invention obviously operates on a much smaller scale and achieves its intended function by very different means.

The inventors are not aware of any technologies that provide tamper-resistance for a microprocessor package, in which the anti-tampering mechanism is integrated into the chip package and capable of destroying the microprocessor. In particular, there are no known technologies that make use of fluids and/or nanofluids to etch, sinter, or thermally destroy microprocessor chip components during a tampering event.

SUMMARY OF THE INVENTION

It is a primary object of the present invention to enhance the art of tamper-resistant electronic devices, which will be destroyed during a tampering event. A variety of fluids and nanofluids are incorporated into the chip level package, such fluids being contained in capsules, channels, or reservoirs (collectively, "cavities") that will be compromised when disassembly of the chip package is attempted, the released fluid then performing a function that causes destruction of a microprocessor chip.

It is another object of the invention to provide a chip package with cavities containing a single fluid or nanofluid that is capable of etching circuitry. This fluid will attack and destroy components of the chip, such as silicon, copper, or gold components, when released due to a tampering event.

It is another object of the invention to provide a chip package with cavities containing multiple fluids or nanofluids. Individual fluids are stable and inactive, but mixing the fluids together results in a chemistry that is capable of etching circuitry. The individual fluids are contained in neighboring cavities for substantially simultaneous release upon tampering.

It is another object of the invention to provide a chip package with cavities containing multiple fluids or nanofluids where mixing the fluids together causes chemical reactions sufficient for thermally damaging die structures.

It is another object of the invention to provide a chip package with an aqueous or organically based nanofluid in which, upon release, the aqueous or organic base fluid evaporates even at room temperature, leaving the nanoparticles behind to sinter and short circuit the chip traces.

It is another object of the invention to provide a chip package whereby nanoparticles are added to the base fluid to increase the overall thermal conductivity of the fluid for die thermal management. These nanoparticles include conductive or ceramic materials. High thermal conductivity nanofluids may be used in combination with the aforementioned etching, heat releasing, or sintering devices to provide die thermal management benefits during normal operation of the electronic components.

It is yet another object of the invention to provide a chip package with through vias and/or micro vias to facilitate fluid or nanofluid access to circuitry components, thereby enhancing the chip destruction efficacy during a tampering event.

It is still another object of the invention to provide a chip package comprising thermal interface materials to enhance die thermal management. These thermal interface materials are in thermal communication with the chip, the fluid or nanofluid, and a heat sink (radiator) component.

It is possible to incorporate one or more fluid-holding devices into the chip package design to provide the anti-tampering functionality described herein: capsules, channels, or reservoirs. The term "cavities" as used herein includes all three types of fluid-filled cavities. The cavity bodies comprise inert materials that do not react with the contained fluids. Upon tampering, the cavity walls will be compromised, and fluid will be released. When the fluid(s) contact the microprocessor, the etching, sintering, or thermal destruction properties of the fluids are activated, thus destroying the circuitry and rendering difficult or futile any attempts at reverse engineering or data extraction. Through-vias and micro vias may also be utilized to facilitate fluid contact with microprocessor elements requiring destruction upon release of the fluid(s) from respective cavities.

BRIEF DESCRIPTION OF THE DRAWINGS

These and other features and advantages of this invention will be more readily understood from the following detailed description of the various aspects of the invention taken in conjunction with the accompanying drawings in which.

The drawings of the invention are not to scale, but merely schematic representations, not intended to portray specific parameters of the invention. The drawings are intended to depict only typical embodiments of the invention, and therefore should not be considered as limiting the scope of the invention. In the drawings, like numbering represents like elements among the drawings. In other words, for the sake of clarity and brevity, like elements and components of each embodiment bear the same designations throughout the description.

DETAILED DESCRIPTION OF THE INVENTION

The present invention is a microchip package including a fluid- or nanofluid-filled capsule, channel, or reservoir. When the package is compromised, the fluid destroys dies or circuitry on the chip.

An anti-tampering approach described herein uses the same chemical processes to remove the chip trace that is left over from the manufacturing process. Because the protective coating is no longer present on the chip, the bare chip trace is susceptible to etching in the same respect as the original conductive or semi-conductive deposition layer during the manufacturing process. Release of etchants onto the bare chip surface, therefore, will compromise the chip architecture as well as the memory and software stored on the chip.

Chip traces may also be damaged if an excessive amount of heat is applied to the chip. Heat may be generated by mixing a variety of two or more chemicals that react together to create an exotherm. As can be appreciated by one skilled in the art, a multitude of known exothermic chemical reaction mechanisms may be utilized for this purpose.

Yet another means to compromise microchip integrity is through the novel use of nanofluids containing electrically conductive nanoparticles. Upon release of the nanofluid, the base fluid evaporates and leaves the conductive nanoparticles behind. These nanoparticles sinter onto the chip traces causing short circuits. Certain other advantages can be realized from the use of nanofluids, particularly the ability of nanoparticles to increase fluid thermal conductivity.

The chip package is capable of self-destruction of the chip upon undesired attempts of reverse engineering by third parties. Fluids capable of attacking chip circuitry are contained within cavities in the chip package. Removal of the lid or substrate for chip isolation compromises the cavity walls and releases the fluid(s). The chip is then damaged by etching, sintering, or heat release. Various chemicals that may be used in conjunction with the present invention are presented below. These are presented by way of example only. It can be appreciated by one skilled in the art that numerous similar mechanisms may be employed without departing from the spirit of the present invention.

I. Single Fluids Capable of Etching Circuitry

In one embodiment of the present invention, a single fluid is contained within a cavity or multiple cavities incorporated into the chip package. Etchants known within the art could be used for etching at least silicon and copper, as described below.

a. Silicon Etching

As is known in the art, certain strong acids or bases of pH>12 may be used to etch silicon. For example, potassium hydroxide reacts with silicon. The hydroxyl group will combine combines with silicon according to the following equation:

Another strong base that may be used as a single fluid to etch silicon is tetramethylammonium hydroxide (TMAH), $(CH_3)_4NOH$.

Also commonly known in the art is silicon etching with hydrofluoric acid (HF).

The most suitable chemical selection may be dependent upon the intended application of the chip sought to be protected. For instance, HF would likely be unsuitable for use in a consumer-oriented device due to health and safety concerns and associated product liability. It may, however, be a suitable fluid for use in devices where secrecy is of paramount importance and users can be adequately trained to mitigate the potential health and safety concerns.

b. Copper Etching

Ferric chloride may be used to etch copper according to the following reaction.

The ferric ion reacts with the metallic copper on the circuit board in a redox reaction, producing a ferrous ion ($Fe^{2+}$) and cuprous or cupric ($Cu^{1+}$ or $Cu^{2+}$) copper. The copper ion, unlike metallic copper, is soluble so it leaves the circuit board and goes into solution.

II. Multiple Fluids, Each Stable and Inactive but Fluid Mixture Will Etch Circuitry a. Silicon Etching In addition to the single chemical components above, the following chemical mixtures are capable of etching silicon. Mixing of the chemicals occurs when both are contained within separate cavities and are released due to a tampering event.

Mixture of nitric acid [$HNO_3$], ammonium fluoride [$NH_4F$], and $H_2O$

Mixture of ethylenediamine [$C_2H_4(NH_2)_2$], hydroquinone [$C_6H_4(OH)_2$], and $H_2O$ Mixture of HF, $NH_4F$, and $H_2O$

Mixture of HF and $HNO_3$ b. Gold Etching

Aqua regia or chrome regia can be used to etch gold components. Aqua regia is a mixture of hydrochloric acid (HCl) and nitric acid (HNO3). Both of these chemicals are individually stable and non-reactive with gold, but when mixed together (generally at a ratio of 3:1 $HCl:HNO_3$) are effective for gold etching. Similarly, chrome regia is a mixture of HCl and chromium trioxide ($CrO_3$), both components individually stable and non-reactive with gold; but the mixture is effective for gold etching.

III. Multiple Fluids, Each Stable and Inactive but Mixing Fluids Will Cause Causes Chemical Reaction Sufficient for Thermally Damaging Die Structures

Another method to achieve the desired destruction of circuitry is heat release resulting from a chemical reaction when multiple fluids are mixed together. For example, an acid-base reaction (e.g., reacting hydrochloric acid with ammonium hydroxide) releases a relatively large amount of heat. It is also possible to use such acid base reaction to reach the temperature favorable for etching as shown below:

Multiple destruction pathways may also be utilized simultaneously. For instance, some individual acids and bases are effective for etching circuitry and also generate heat when mixed together. Multiple pathways may increase the rate of the etching reaction(s) or enhance the overall efficacy of chip destruction. The following chemical reactions can be used for this purpose:

It is also possible that heat generated during the initial chemical reaction can further exothermically decompose the product and generate an even higher amount of energy. The decomposition of perchlorate is highly exothermic. Various other chemicals may also be selected for generating the requisite exotherm. The amount of heat released for chip thermal destruction is determined by chip size and thickness. This, in turn, will play a role in selecting the appropriate chemistry for a given application.

IV. Nanofluids that can Act as Thermal Fluids and Sinter Upon Release, Causing Short Circuits In addition to the aforementioned chip destruction capabilities, nanofluids may be incorporated into the present invention. Nanofluids include novel electronic, magnetic, optical, thermal, and biological properties. They are formed when nanoparticles are dispersed in a base fluid medium. A nanofluid is best achieved with different nanoparticles having low viscosity, in the range of 10-50 cP. Nanofluids generally contain from 1-20% nanoparticles, but it is possible to use a higher nanoparticle loading. The key to optimal nanofluid selection is to achieve stability and homogeneity of the nanoparticles in solution. Depending on the size of particles and the dispersing medium, a range of function fluids can be generated. For example, certain conductive or ceramic nanoparticles in aqueous ethylene glycols are proposed as heat transfer fluids because of their very high thermal transport capacities. This property can also be used in a microprocessor chip package for die thermal management.

Moreover, nanofluids may contain electrically conductive nanoparticles within an aqueous or organic base, wherein upon release of the nanofluid, the aqueous or organic base evaporates (even at room temperature), concentrating the nanoparticles into solution. When substantially all of the base fluid has evaporated, the nanoparticles sinter onto the surface of the circuit board causing short circuits with concomitant malfunctions of the circuitry. Metal nanoparticles, such as gold or silver, make effective sintering agents.

In addition to the sintering function, nanoparticles may also be introduced into the fluids to increase thermal conductivity, thereby facilitating die thermal management. Several metal or ceramic nanoparticles, including gold, silver, platinum, ZnO, silicon carbide, carbon, nanotubes, and graphite are effective for this purpose. Similarly, a fluid with aqueous base may contain polyethylene glycol (PEG) for enhanced thermal conductivity.

In certain cases, even nanofluids with enhanced thermal conductivity may insulate the chip circuitry more than desired. In that case, thermal interface materials may be incorporated into the chip package design. These could be "pillars" of high thermal conductivity materials positioned to be in thermal communication with the chip and a heat sink (radiator) component of the chip package. Filled silicone-based materials are commonly used as thermal interface material. It can be thermally conducting silicone based paste, grease, sheet or sponge. It is also possible to use highly filled thermally conducting adhesives as thermal interface materials. In one example, 90 wt % silver filled epoxy adhesives include silver as a nano particle, micro particle, or mixture of nano and micro particles. High thermal conductivity nanofluids may also be used in conjunction with thermal interface materials, if desired.

A variation of the present invention is a chip package having a passivation layer on the underside of the microprocessor chip, and through vias in the microprocessor chip and/or micro vias in the passivation layer. The vias act as fluid pathways to facilitate contact of the circuit board with the fluids when they are released due to tampering. As such, they may improve the efficacy of, or reduce the time required for, chip destruction. Through vias and micro vias may be incorporated into the design for any of the chip destruction pathways described above.

Figure 1:
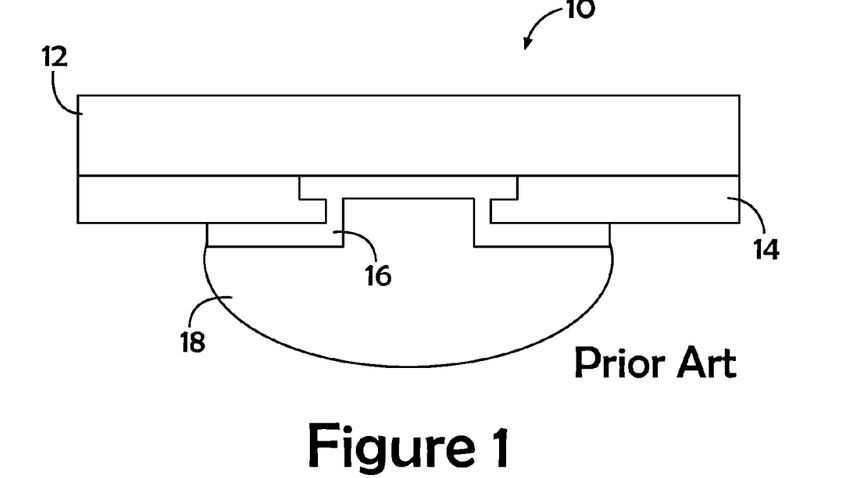
FIG. 1 is cross sectional view of a prior art microchip device offering no protection against tampering events.

In FIG. 1 there is schematically illustrated a prior art internal chip package 10 comprising a chip 12 and metal pads or metal limiting pads 16 electrically adhered to selected portions of chip 12 through recesses in a passivation layer 14. Solder bumps 18 are electrically adhered to metal pads or metal limiting pads 16 for electrical connections to external components.

Figure 2:
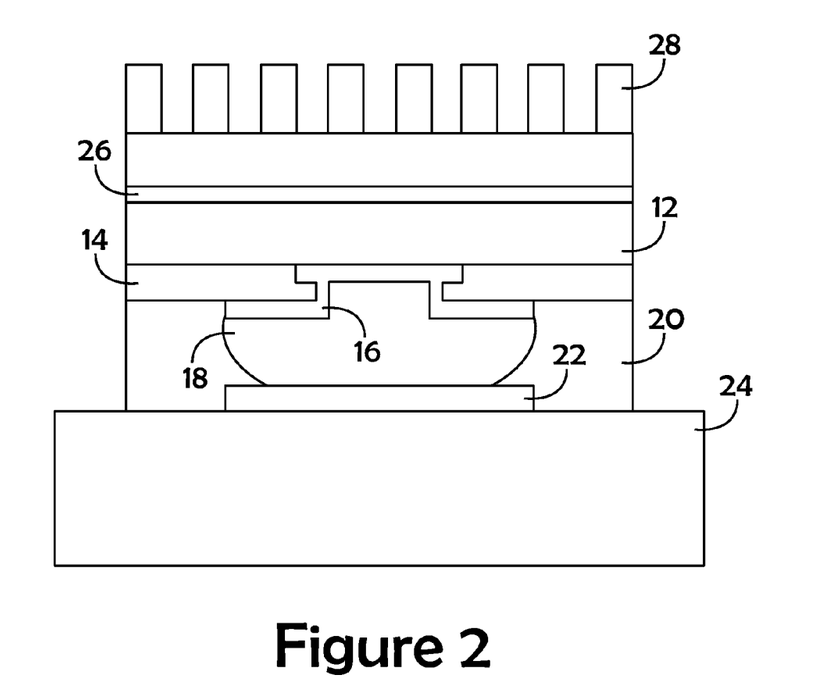
FIG. 2 is a cross sectional view of a chip package mounted on a substrate and comprising a heat sink and fluid bag.

FIG. 2 schematically illustrates a tamper-resistant chip package additionally comprising top surface metal (TSM) 22, such as copper pads, electrically adhered to solder bumps 18. Also included is underfill 20 as is commonly used in the art to protect the integrity of solder joints, with all of the components mounted on substrate 24. A heat sink 28 is mounted on top of a fluid bag or reservoir 26. A single fluid bag 26 in this embodiment could contain a single fluid or nanofluid capable of etching or sintering circuitry upon release. The fluid is released upon cutting or prying away of the lid (here, heat sink 28). Moreover, a nanofluid of enhanced thermal conductivity could be contained within fluid bag 26 for die thermal management. Additionally, fluid bag 26 could comprise a plurality of fluid bags to take advantage of a fluid mixture destruction technology as described herein.

Figure 3:
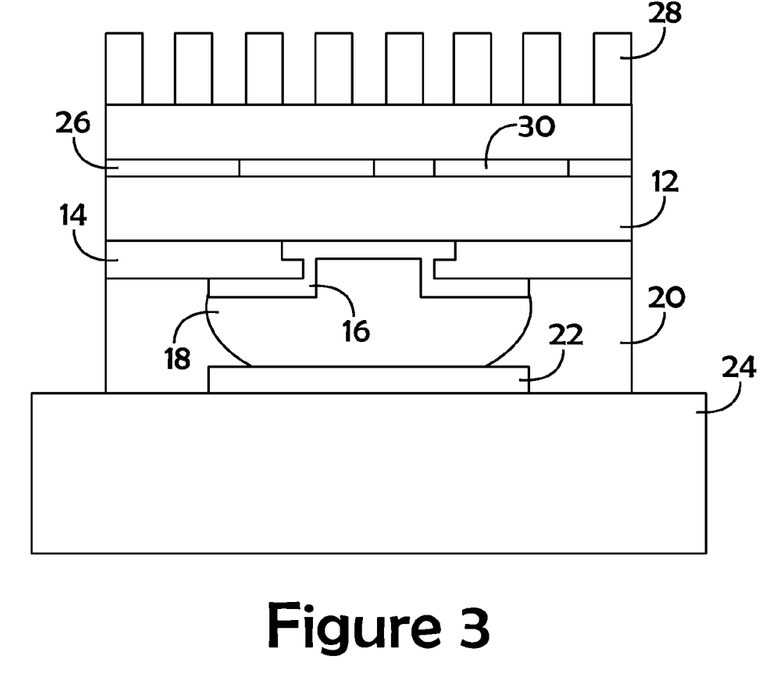
FIG. 3 is a cross sectional view of a chip package mounted on a substrate and comprising a heat sink, fluid bag, and thermal interface materials to enhance die thermal management.

FIG. 3 schematically illustrates a chip package further comprising a plurality of thermal interface materials 30 in thermal communication with chip 12 and heat sink 28 for die thermal management. Fluid bag 26 may contain various circuitry-destroying fluids, as described herein, and may also contain nanofluids of enhanced thermal conductivity for die thermal management.

Figure 4:
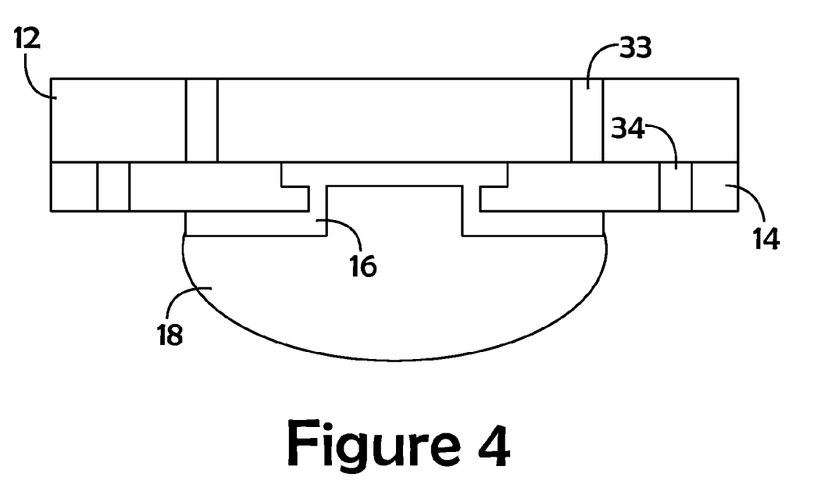
FIG. 4 is a cross sectional view of a basic chip package with through vias and micro vias included.

FIG. 4 schematically illustrates an internal chip package comprising through vias 33 (tunneling through chip 12) and micro vias 34 (tunneling through passivation layer 14). Passivation layer 14 can be a filled polymer, and the filler can be etched to access the circuitry. Through vias 33 and micro vias 34 enhance the efficacy of chip destruction by providing fluid pathways, whereby released fluids can travel through the vias to achieve better contact with the microprocessor chip 12. This enhances the etching, sintering, or thermal destruction functions of the present invention.

Figure 5:
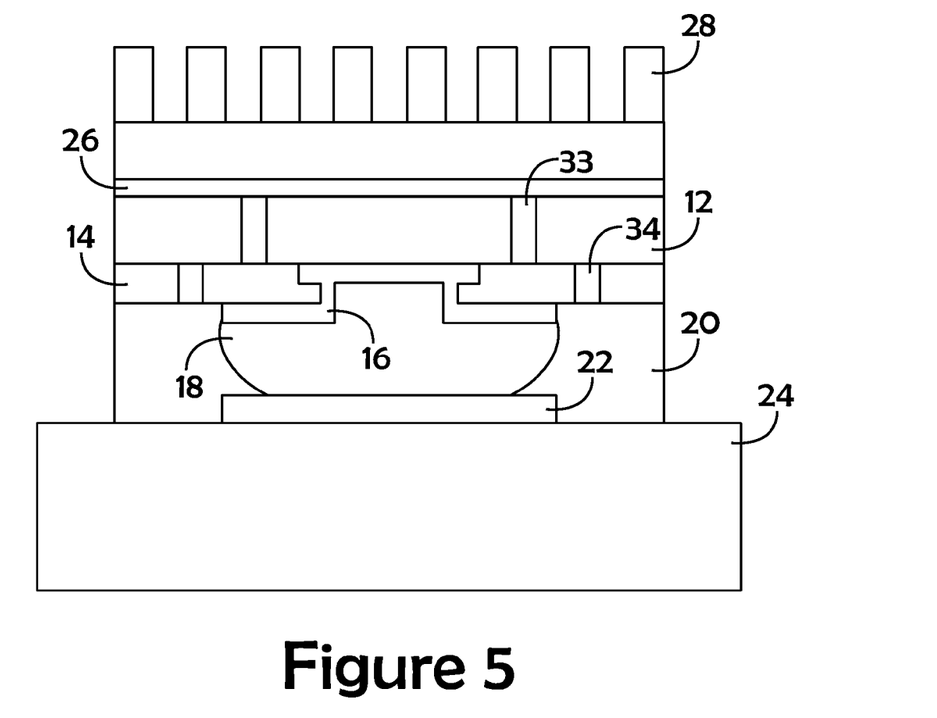
FIG. 5 is a cross sectional view of a chip package mounted on a substrate and comprising a heat sink, fluid bag, through vias, and micro vias.

FIG. 5 shows the device of FIG. 4 incorporated into a chip package design. Chip destruction capabilities are included with the addition of fluid bag 26, through vias 33 and micro vias 34.

Figure 6:
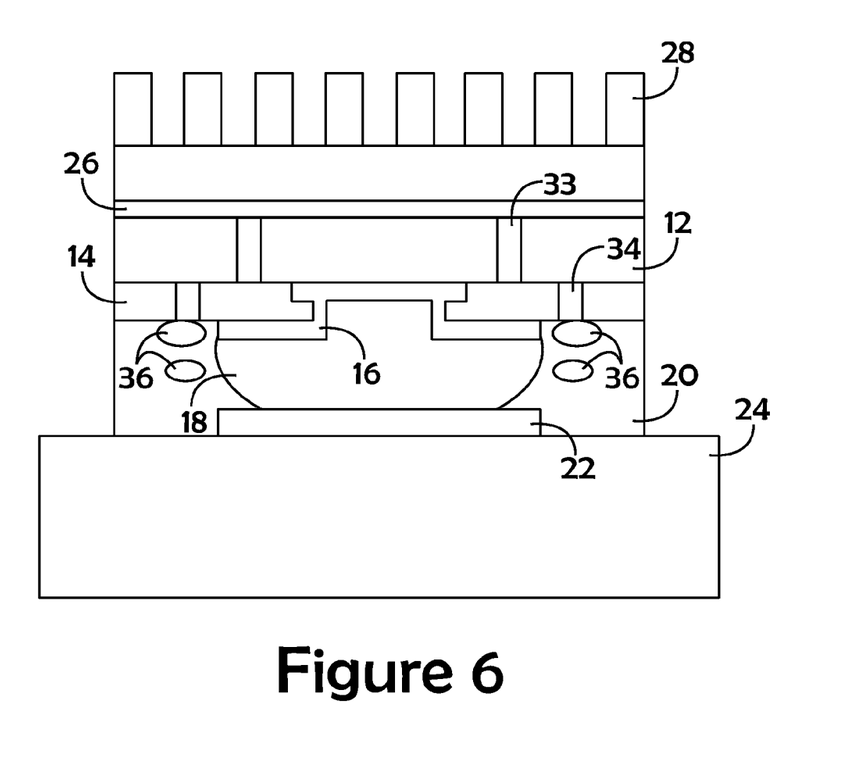
FIG. 6 is a cross sectional view of a chip package mounted on a substrate and comprising a heat sink, fluid bag, through vias, micro vias, and fluid capsules.

FIG. 6 schematically illustrates a chip package further comprising a plurality of fluid capsules 36 contained within underfill 30. Inclusion of fluids on the underside of the chip package facilitates chip destruction in the event that access through the bottom (or substrate) side of the chip package is attempted. Fluids that are released from capsules 36 travel into micro vias 34 and/or through vias 33 to contact chip 12. In addition, multiple capsules can contain multiple fluids for die destruction initiated by the fluid mixing process. Capsules 36 may also take the form of channels or the like. As can be appreciated by one skilled in the art, a variety of cavity shapes and sizes may be successfully incorporated into the present invention.

Figure 7:
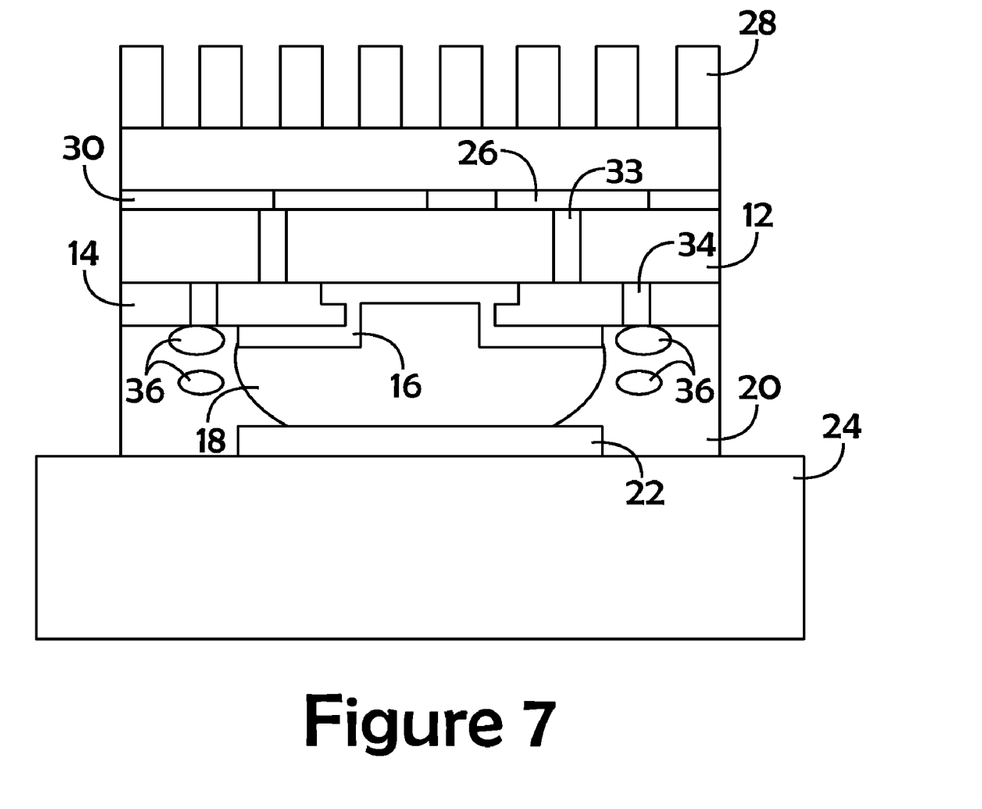
FIG. 7 is a cross sectional view of a chip package mounted on a substrate and comprising a heat sink, fluid bag, through vias, micro vias, fluid capsules, and thermal interface materials.

FIG. 7 shows the chip package of FIG. 6 with the inclusion of thermal interface materials to facilitate die thermal management.

Since other combinations, modifications and changes varied to fit particular operating requirements and environments will be apparent to those skilled in the art, the invention is not considered limited to the chosen preferred embodiments for purposes of this disclosure, but covers all changes and modifications which do not constitute departures from the true spirit and scope of this invention.

Having thus described the invention, what is desired to be protected by Letters Patent is presented in the subsequently appended claims.

What is claimed is:

1. A tamper-resistant microprocessor chip package comprising:
   a microprocessor chip comprising silicon components;
   a fluid containment layer having at least one cavity and at least one chemical component; a lid, wherein said fluid containment layer is positioned between said lid and said microprocessor chip, and;
   fluid disposed in said cavity, whereby upon tampering and/or damaging said lid, said fluid and said chemical component are released onto a chip surface etching circuitry thereon, thereby destroying the electrical functionality of said microprocessor chip; and
   wherein said fluid is chosen from a group: potassium hydroxide, tetramethylammonium hydroxide, and hydrofluoric acid.

2. The chip package of claim 1, wherein said microprocessor further contains copper components and said fluid is further capable of etching said copper components.

3. The chip package of claim 2, wherein said fluid comprises ferric chloride.

4. The chip package of claim 1, wherein said fluid comprises a nanofluid.

5. The chip package of claim 4, wherein said nanofluid comprises a plurality of electrically conductive nanoparticles and a volatile aqueous or organic base fluid.

6. The chip package of claim 5, wherein said nanofluid has a higher thermal conductivity than said base fluid.

7. The chip package of claim 6, wherein said plurality of nanoparticles is selected from a group consisting of gold, silver, platinum, zinc oxide, silicon carbide, carbon, nanotubes, and graphite.

8. The chip package of claim 1, further comprising a plurality of thermal interface materials in thermal communication with said microprocessor chip and said lid.

9. The chip package of claim 1, wherein said microprocessor chip has a top side and a bottom side, and further comprising a plurality of through vias extending therebetween.

10. The chip package of claim 1, further comprising a passivation layer having a top side and a bottom side, and a plurality of micro vias extending therebetween.

11. The chip package of claim 1, wherein said fluid containment layer comprises a plurality of cavities and a plurality of fluids, each of said plurality of cavities at least partially filled with at least one of said plurality of fluids, and at least one of said plurality of fluids being in chemically inactive state but, upon mixing with at least one other of said plurality of fluids, forming a fluid mixture for destroying the electrical functionality of said microprocessor chip.

12. The chip package of claim 11, wherein said fluid containment layer is an underfill layer.

13. The chip package of claim 11, wherein said plurality of fluids comprise at least one of a group: nitric acid, ammonium fluoride, ethylenediamine, hydroquinone, hydrofluoric acid, ammonium fluoride, and water.

14. The chip package of claim 11, wherein said microprocessor chip contains gold components and said fluid mixture is capable of etching said gold components.

15. The chip package of claim 14, wherein said plurality of fluids comprises at least one of the group: hydrochloric acid, nitric acid, and chromium trioxide.

16. The chip package of claim 11, wherein mixing at least two of said plurality of fluids initiates an exothermic chemical reaction sufficient to thermally damage said microprocessor chip.

17. The chip package of claim 16, wherein said plurality of fluids comprises an acid and a base.

18. The chip package of claim 16, wherein at least one of said plurality of fluids is also capable of etching circuitry.

19. The chip package of claim 18, wherein said plurality of fluids comprises at least one of the group: nitric acid, triethanolamine, perchloric acid, and potassium hydroxide.

20. The chip package of claim 11, wherein at least one of said plurality of fluids comprises a nanofluid.

21. The chip package of claim 20, wherein said nanofluid comprises a plurality of electrically conductive nanoparticles and a volatile aqueous or organic base fluid.

22. The chip package of claim 21, wherein said nanofluid comprises a plurality of nanoparticles and an aqueous or organic base fluid, said nanofluid having a higher thermal conductivity than said base fluid.

23. The chip package of claim 22, wherein said plurality of nanoparticles is selected from a group consisting of gold, silver, platinum, zinc oxide, silicon carbide, carbon, nanotubes, and graphite.

24. A tamper-resistant microprocessor chip package comprising:
   a microprocessor chip;
   a plurality of fluid containment layers each having at least one cavity; and
   a lid and an underfill layer, wherein one of said plurality of fluid containment layers is positioned between said lid and said microprocessor chip, and one of said plurality of fluid containment layers is said underfill layer; and
   a fluid disposed in said at least one cavity, said fluid comprising at least one chemical component, whereby upon tampering and/or damaging said lid, said fluid and said chemical component are released on a microprocessor chip surface destroying the electrical functionality of said microprocessor chip by etching circuitry thereon, wherein said fluid is chosen from a group: potassium hydroxide, tetramethylammonium hydroxide, and hydrofluoric acid.

25. The chip package of claim 24, further comprising a plurality of fluids, each of said cavities at least partially filled with at least one of said plurality of fluids, and at least one of said plurality of fluids being in chemically inactive state but upon mixing with at least one other of said plurality of fluids, forming a fluid mixture for destroying the electrical functionality of said microprocessor chip by etching circuitry thereon.

* * * * *